United States Patent
Zhang

(10) Patent No.: US 9,411,240 B2
(45) Date of Patent: Aug. 9, 2016

(54) METHOD FOR COMPENSATING SLIT ILLUMINATION UNIFORMITY

(71) Applicant: UNITED MICROELECTRONICS CORPORATION, Hsinchu (TW)

(72) Inventor: Zhong-Gui Zhang, Singapore (SG)

(73) Assignee: UNITED MICROELETRONICS CORPORATION, Hsinchu (TW)

( * ) Notice: Subject to any disclaimer, the term of this patent is extended or adjusted under 35 U.S.C. 154(b) by 184 days.

(21) Appl. No.: 14/277,788

(22) Filed: May 15, 2014

(65) Prior Publication Data

US 2015/0331328 A1 Nov. 19, 2015

(51) Int. Cl.
*G03F 7/20* (2006.01)

(52) U.S. Cl.
CPC ............ *G03F 7/70066* (2013.01); *G03F 7/20* (2013.01); *G03F 7/70083* (2013.01); *G03F 7/70558* (2013.01)

(58) Field of Classification Search
CPC ............ G03F 7/70083; G03F 7/70066; G03F 7/70075; G03F 7/70191
See application file for complete search history.

(56) References Cited

U.S. PATENT DOCUMENTS

| | | | |
|---|---|---|---|
| 7,532,308 B2 * | 5/2009 | Bouman | G03F 7/70083 355/67 |
| 8,629,973 B2 | 1/2014 | Zimmerman | |
| 2005/0286037 A1 * | 12/2005 | Chung | G03B 27/74 355/69 |
| 2006/0139608 A1 * | 6/2006 | Wiener | G02B 7/346 355/69 |
| 2007/0057201 A1 * | 3/2007 | Neerhof | G03F 7/70191 250/492.2 |
| 2007/0103665 A1 * | 5/2007 | Zimmerman | G02B 7/346 355/68 |
| 2007/0139630 A1 | 6/2007 | Kleman | |
| 2010/0302525 A1 * | 12/2010 | Zimmerman | G03F 7/70133 355/71 |

\* cited by examiner

*Primary Examiner* — Steven H Whitesell Gordon
(74) *Attorney, Agent, or Firm* — Ding Yu Tan

(57) ABSTRACT

A method for compensating a slit illumination uniformity includes executing a first lithography operation and recording an initial slit uniformity profile; executing a slit uniformity optimization process and recording an optimized slit uniformity profile; and offsetting the optimized slit uniformity profile to obtain a working slit uniformity profile such that the working slit uniformity profile has a mean value closest to that of the initial slit uniformity profile.

11 Claims, 3 Drawing Sheets

METHOD FOR COMPENSATING SLIT ILLUMINATION UNIFORMITY

TECHNICAL FIELD

The present invention relates generally to an energy compensation method, especially to a method for compensating the slit illumination uniformity of a lithographic apparatus.

BACKGROUND

In the manufacture of integrated circuits (ICs), a lithographic apparatus is used to apply a desired pattern onto a target portion of a substrate. Slit uniformity is a key factor for lithographic apparatuses. If the result exceeds or fails to meet the desired specification, the lithographic apparatus will take related actions to reduce the slit uniformity, e.g., adjusting the uniformity improvement package (UIP), uniformity correction module (UNICON) plate, or gradient filter replacement. After the slit uniformity optimization is performed, the lithographic apparatus will check the critical dimension uniformity (CDU) monitor value, and perform a spot sensor conversion factor (SSCF) compensation based on the CDU monitor result. To perform such SSCF compensation, the only reference value is the CDU monitor result. This is not a straight-forward strategy, any steps in the CDU monitor procedure flow can impact the SSCF compensation value. A wrong SSCF compensation value will negatively impact the product critical dimension (CD) seriously, so that it could result in wafer rework, or even wafer scrap.

SUMMARY

In a view of the invention, a method for compensating a slit illumination uniformity is provided. The method includes executing a first lithography operation and recording an initial (first) slit uniformity profile; executing a slit uniformity optimization process and recording an optimized (second) slit uniformity profile; and executing an offsetting process for offsetting the optimized slit uniformity profile to obtain a working (fourth) slit uniformity profile such that the working slit uniformity profile has a mean value closest to that of the initial slit uniformity profile.

In more detailed descriptions, the offsetting process includes steps of: offsetting the optimized slit uniformity profile under a specified ratio determined according to the initial slit uniformity profile and the optimized slit uniformity to obtain an automatically-calibrated (third) slit uniformity profile; finding the maximum and the minimum difference points between the initial slit uniformity profile and the automatically-calibrated slit uniformity profile; calculating a calibration factor according to the maximum and minimum difference points; and offsetting the automatically-calibrated slit uniformity profile to the working slit uniformity profile according to the calibration factor.

In general, the automatically-calibrated slit uniformity profile is generated by an automatic calibration of a lithographic apparatus. In other view of the invention, the method of the invention is applied for performing a compensation of the slit illumination uniformity of such a lithographic apparatus. At least one slit uniformity profile is generated through the lithographic apparatus, and then the compensation is finished by referring to the slit uniformity profile(s) generated by the lithographic apparatus itself.

The slit uniformity profiles mentioned above includes a first slit uniformity profile and a second slit uniformity profile which are generated before and after the slit uniformity optimization of the lithographic apparatus, respectively.

A third slit uniformity profile is obtained by offsetting the second slit uniformity profile based on a ratio determined by the first slit uniformity profile and the second slit uniformity profile. The value of a compensation factor is calculated according to the first slit uniformity profile and the third slit uniformity profile, and the slit illumination uniformity compensation of the lithography apparatus is performed according to the compensation factor.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
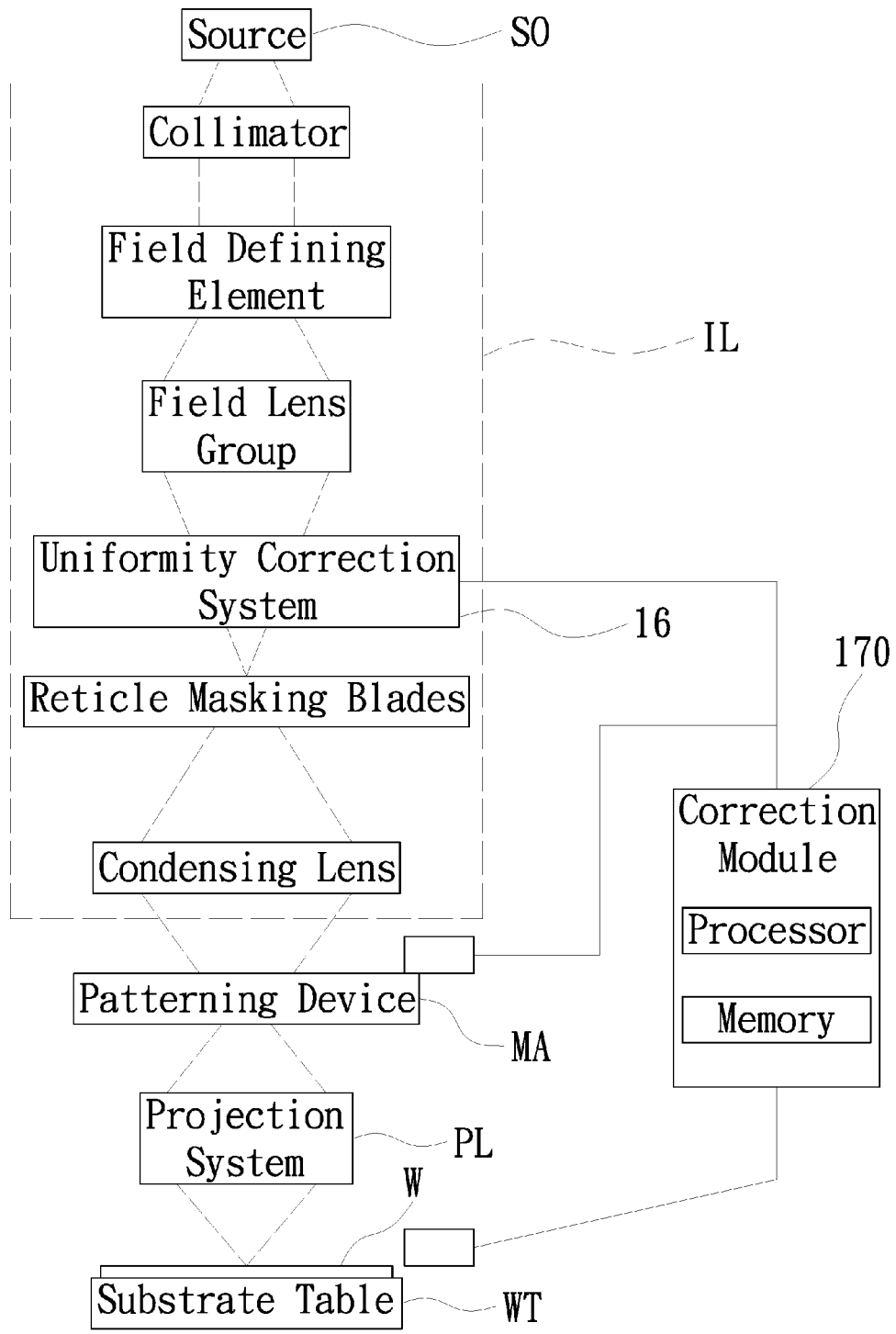
FIG. 1 is a block diagram illustrating a lithography apparatus.

The method for compensating the slit illumination uniformity of the present invention is applied on the lithographic apparatus as shown in FIG. 1, which includes a radiation source SO, an illuminator IL, a patterning device MA, a projection system PL, a substrate table WT, and a correction module 170. The illuminator IL receives a radiation beam from the radiation source SO, and submits the radiation beam to the substrate W through the patterning device MA, so that the pattern on the patterning device MA can be transferred onto the surface of the substrate W. A uniformity correction system 16 is built within the illuminator IL so as to correct the uniformity intensity in portions as desired.

Figure 2:
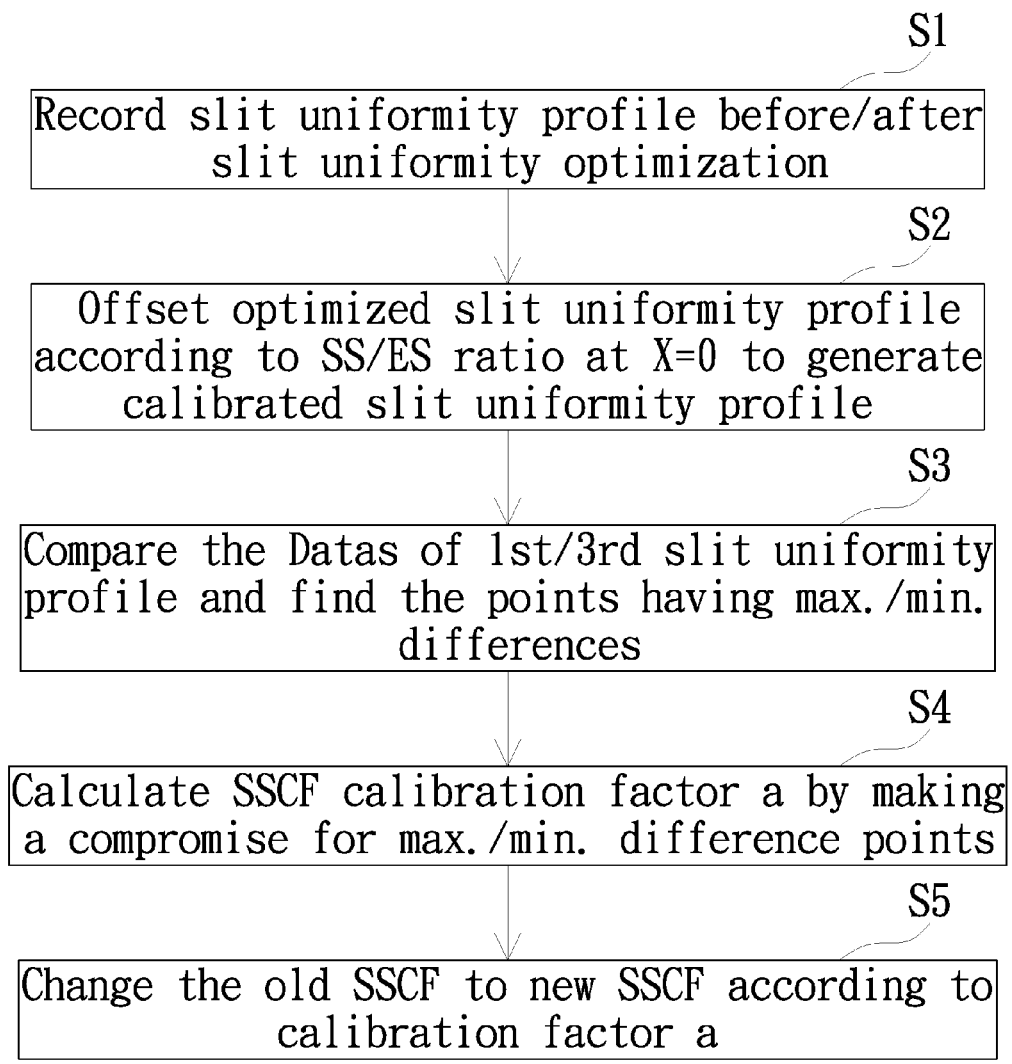
FIG. 2 is a process flow diagram illustrating a compensation method for slit illumination uniformity according to an embodiment of the present invention.
Figure 3:
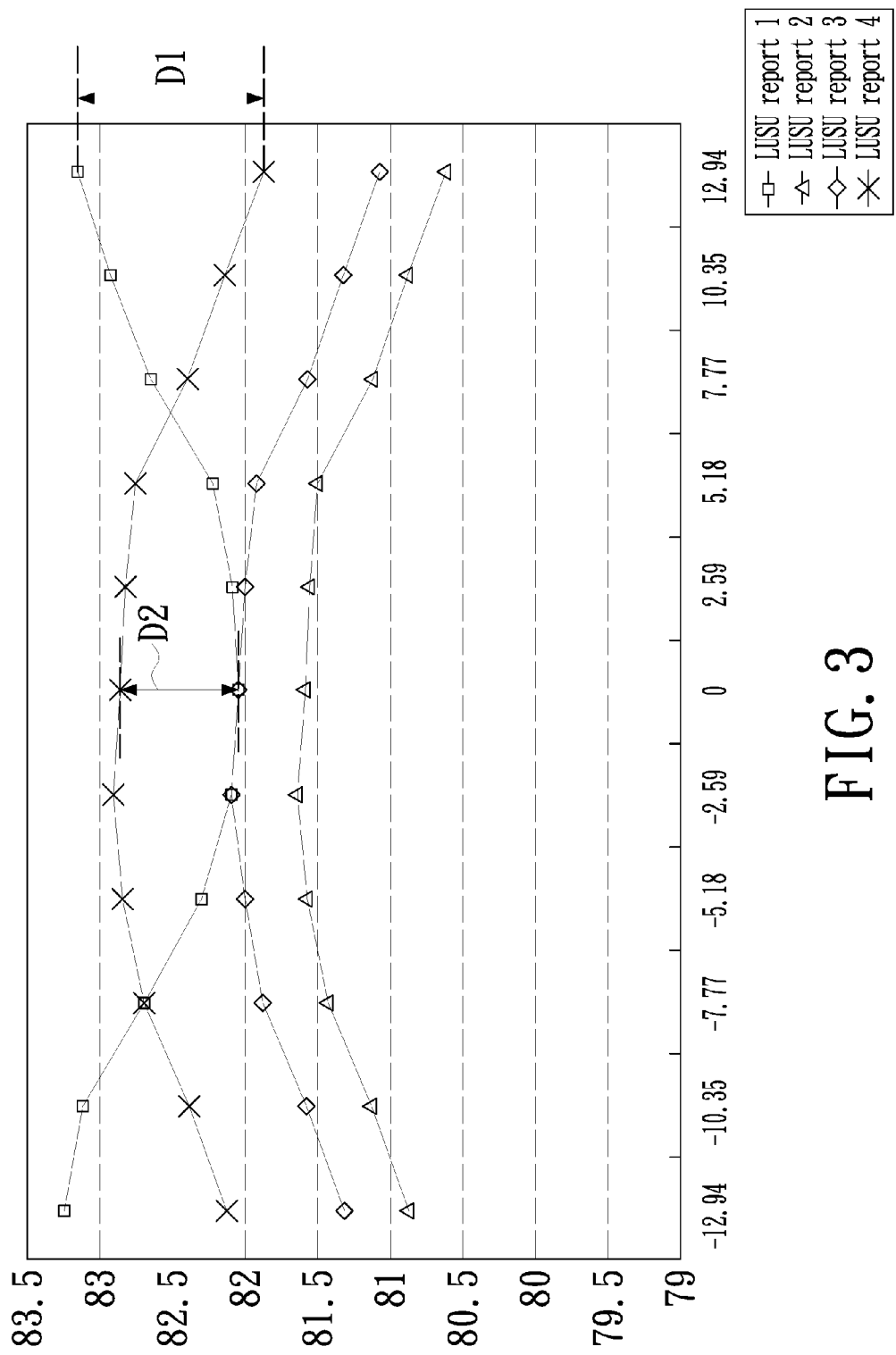
FIG. 3 is a diagram illustrating the silt uniformity profiles generated according to the process shown in FIG. 2.

The method for compensating the slit illumination uniformity of the present invention can be understood through referring to FIGS. 2 and 3, which illustrate the process flow of the compensation method for slit illumination uniformity, and the silt uniformity profiles generated during the execution of the process flow. The processes S1-S5 shown in FIG. 2 are described in detail as Steps S1-S5 in the following descriptions, while the illumination slit uniformity (LUSU) reports 1-4 shown in FIG. 3 represent the first silt uniformity profile to the fourth silt uniformity profile, respectively. In FIG. 3, the X-axis (horizontal axis) represents the related location along a x-direction on the surface of the substrate W, while the Y-axis (vertical axis) represents the SS/ES ratio related to the slit uniformity.

Step S1: Combining 2 (two) illumination slit uniformity (LUSU) reports obtained before and after slit uniformity optimization, to form the so-called 1st and 2nd LUSU reports.

Step S2: Offset the 2nd LUSU report according to the original point's (X=0) SS/ES ratio, as shown in FIG. 3, which is a simulation performed after the energy sensor conversion factor (ESCF) calibration, so that a 3rd LUSU report will be generated.

Step S3: Then, for example, 11 data points are collected for both the LUSU report 1 and the LUSU report 3, upon which SSCF calibration will try to minimize all those 11 data points' differences in value. Later all of the corresponding data point's SS/ES ratio data (LUSU report 3-LUSU report 1) are compared, and the minimum difference point and maximum difference point are determined.

Step S4: The SSCF calibration factor for the LUSU report 3 will be determined according to data points at the locations having the minimum difference value and the maximum difference value between the LUSU reports 1 and 3, such SSCF calibration factor (so-called "a") will satisfied the following equation:

$$a*\text{LUSU Report 3 } SS/ES \text{ ratio}_{x=k} - \text{LUSU Report 3} \\ SS/ES \text{ ratio}_{x=k} = \text{LUSU Report 1 } SS/ES \text{ ratio}_{x=j} - \\ a*\text{LUSU Report 3 } SS/ES \text{ ratio}_{x=j} \quad [1]$$

It is noticeable that in this case, the data points at X=0(i.e. k=0), and X=12.94 (i.e. j=12.94) and their related corresponding SS/ES ratio are chosen, because they represent the maximum difference point, and the minimum difference point, respectively. In this case, the detailed formula/equation is expressed as follow:

$$a*82.05 - 82.05 = 83.15 - a*81.08, \text{ so } a = 1.013. \quad [2]$$

Step S5: New SSCF will be provided once the variable number a was confirmed according to the following equation:

$$\text{SSCF}_{new} = \text{SSCF}_{old}*(2-a) \quad [3]$$

For example, in a lithographic apparatus KSCAN-06, the original SSCF is 2.325, and after performing calculations using equation [3] above, the new SSCF is determined to be 2.295.

The first to the fourth silt uniformity profiles as described above can be deemed as the initial, optimized, automatically-calibrated, and working slit uniformity profiles, respectively. Beside the steps mentioned above, any other method that can offset the optimized slit uniformity profile to the position of the working slit uniformity profile should be considered as an another embodiment of the present invention.

In summary, by referring to the slit uniformity profile instead of relying on the CDU monitor result only, a more reliable slit uniformity compensation method is obtained, and the risk of wrong or incorrect slit uniformity compensation is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for compensating a slit illumination uniformity associated with a lithographic apparatus, the lithographic apparatus including a radiation source, an illuminator, a patterning device, a projection system, a substrate table, and a correction module, comprising steps of:
   executing a first lithography operation and recording an initial slit uniformity profile;
   executing a slit uniformity optimization process and recording an optimized slit uniformity profile; and
   executing an offsetting process for offsetting said optimized slit uniformity profile to obtain a working slit uniformity profile, wherein the difference between the mean values of said initial slit uniformity profile and said working slit uniformity profile is minimized.

2. A method according to claim 1, wherein said offsetting process includes steps of:
   offsetting said optimized slit uniformity profile under a specified ratio determined according to said initial slit uniformity profile and said optimized slit uniformity to obtain an automatically-calibrated slit uniformity profile;
   comparing between said initial slit uniformity profile and said automatically-calibrated slit uniformity profile and finding a plurality of data points having the maximum difference value and the minimum difference value;
   calculating a calibration factor according to said data points; and
   offsetting said automatically-calibrated slit uniformity profile to said working slit uniformity profile according to said calibration factor.

3. A method according to claim 2, wherein said automatically-calibrated slit uniformity profile is generated by an automatic calibration of a lithographic apparatus.

4. A method for performing a compensation of the slit illumination uniformity that is applied on a lithographic apparatus, comprises steps of:
   generating at least one slit uniformity profile through said lithographic apparatus; and
   finishing said compensation of the slit illumination uniformity by referring to said at least one slit uniformity profile, wherein
   said at least one slit uniformity profile includes a first slit uniformity profile and a second slit uniformity profile, wherein said first slit uniformity profile and said second slit uniformity profile are respectively generated before and after a slit uniformity optimization of said lithographic apparatus, and wherein
   said at least one slit uniformity profile further includes a third slit uniformity profile, wherein said third slit uniformity profile is obtained by offsetting said second slit uniformity profile according to said first slit uniformity profile and said second slit uniformity profile.

5. The method according to claim 4, wherein the value of a compensation factor is calculated according to said first slit uniformity profile and said third silt uniformity profile, and the slit illumination uniformity compensation of said lithography apparatus is performed according to said compensation factor.

6. A method for compensating a slit illumination uniformity that is applied on a lithographic apparatus, comprising steps of:
   executing a first lithography operation and recording an initial slit uniformity profile;
   executing a slit uniformity optimization process and recording an optimized slit uniformity profile; and
   executing an offsetting process for offsetting said optimized slit uniformity profile to obtain a working slit uniformity profile, wherein the difference between the mean values of said initial slit uniformity profile and said working slit uniformity profile is minimized.

7. The method according to claim 6, wherein said offsetting process includes steps of:
   offsetting said optimized slit uniformity profile under a specified ratio determined according to said initial slit uniformity profile and said optimized slit uniformity to obtain an automatically-calibrated slit uniformity profile;

comparing between said initial slit uniformity profile and said automatically-calibrated slit uniformity profile and finding a plurality of data points having the maximum difference value and the minimum difference value;

calculating a calibration factor according to said data points; and offsetting said automatically-calibrated slit uniformity profile to said working slit uniformity profile according to said calibration factor.

8. The method according to claim 7, wherein said automatically-calibrated slit uniformity profile is generated by an automatic calibration of a lithographic apparatus.

9. A method for compensating a slit illumination uniformity, that is applied on a lithographic apparatus, the lithographic apparatus including a patterning device, and the patterning device is providing a pattern, which is transferred onto a surface of a substrate, comprising steps of:

executing a first lithography operation and recording an initial slit uniformity profile;

executing a slit uniformity optimization process and recording an optimized slit uniformity profile; and executing an offsetting process for offsetting said optimized slit uniformity profile to obtain a working slit uniformity profile, wherein the difference between the mean values of said initial slit uniformity profile and said working slit uniformity profile is minimized.

10. The method according to claim 9, wherein said offsetting process includes steps of:

offsetting said optimized slit uniformity profile under a specified ratio determined according to said initial slit uniformity profile and said optimized slit uniformity to obtain an automatically-calibrated slit uniformity profile;

comparing between said initial slit uniformity profile and said automatically-calibrated slit uniformity profile and finding a plurality of data points having the maximum difference value and the minimum difference value;

calculating a calibration factor according to said data points; and offsetting said automatically-calibrated slit uniformity profile to said working slit uniformity profile according to said calibration factor.

11. The method according to claim 10, wherein said automatically-calibrated slit uniformity profile is generated by an automatic calibration of a lithographic apparatus.

* * * * *